United States Patent
Kimura et al.

(10) Patent No.: US 9,950,958 B2
(45) Date of Patent: Apr. 24, 2018

(54) ELECTROMAGNETIC EFFECT MATERIAL AND CERAMIC ELECTRONIC COMPONENT

(71) Applicant: Murata Manufacturing Co., Ltd., Nagaokakyo-shi, Kyoto-fu (JP)

(72) Inventors: Tsuyoshi Kimura, Nagaokakyo (JP); Koji Okumura, Nagaokakyo (JP); Yasuhiro Yamaguchi, Nagaokakyo (JP); Kohei Haruki, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 180 days.

(21) Appl. No.: 14/851,752

(22) Filed: Sep. 11, 2015

(65) Prior Publication Data
US 2017/0152185 A1 Jun. 1, 2017

Related U.S. Application Data

(63) Continuation of application No. PCT/JP2014/056961, filed on Mar. 14, 2014.

(30) Foreign Application Priority Data

Mar. 14, 2013 (JP) ................. 2013-051557

(51) Int. Cl.
| | | |
|---|---|---|
| H01F 1/34 | (2006.01) |
| H01B 1/08 | (2006.01) |
| C04B 35/26 | (2006.01) |
| C04B 35/64 | (2006.01) |
| C04B 35/626 | (2006.01) |
| C04B 35/634 | (2006.01) |
| C04B 35/638 | (2006.01) |
| H01F 1/03 | (2006.01) |
| H01L 43/02 | (2006.01) |
| H01L 43/08 | (2006.01) |
| H01L 43/12 | (2006.01) |
| H01L 43/10 | (2006.01) |
| H01L 27/22 | (2006.01) |

(52) U.S. Cl.
CPC ...... *C04B 35/2633* (2013.01); *C04B 35/6262* (2013.01); *C04B 35/6264* (2013.01); *C04B 35/638* (2013.01); *C04B 35/63416* (2013.01); *C04B 35/64* (2013.01); *H01F 1/0315* (2013.01); *H01F 1/0317* (2013.01); *H01L 27/222* (2013.01); *H01L 43/02* (2013.01); *H01L 43/08* (2013.01); *H01L 43/10* (2013.01); *H01L 43/12* (2013.01); *C04B 2235/3213* (2013.01); *C04B 2235/3215* (2013.01); *C04B 2235/3274* (2013.01); *C04B 2235/3275* (2013.01); *C04B 2235/602* (2013.01); *C04B 2235/656* (2013.01); *C04B 2235/6567* (2013.01); *C04B 2235/787* (2013.01); *C04B 2235/788* (2013.01); *C04B 2235/96* (2013.01)

(58) Field of Classification Search
CPC ............ C04B 35/2633; C04B 35/6263; C04B 35/6264; C04B 35/63416; C04B 35/638; C04B 35/66; H01F 1/0315; H01F 1/0317; H01L 27/222; H01L 43/02; H01L 43/08; H01L 43/10; H01L 43/12
See application file for complete search history.

(56) References Cited

U.S. PATENT DOCUMENTS

2009/0196818 A1 8/2009 Tokura et al.

FOREIGN PATENT DOCUMENTS

| EP | 1340716 | * 9/2003 |
| JP | 2009-224563 A | 10/2009 |
| JP | 2012-001396 A | 1/2012 |
| WO | WO 2007/135817 A1 | 11/2007 |

OTHER PUBLICATIONS

Takada et al, "Crystal and magnetic structures and their tempearure dependence of Co2Z-type hexaferrite (Ba,Sr)3Co2Fe24O41 by High Temperature Neutron Diffraction", Journ. App. Phys. 100, 043904, 1-7, 2006.*
International Search Report issued for PCT/JP2014/056961, dated Apr. 28, 2014.
Written Opinion of the International Searching Authority issued for PCT/JP2014/056961, dated Apr. 28, 2014.
X. Zhang et al.; "Magnetodielectric effect in Z-type hexaferrite"; Applied Physics Letters 100, Jan. 17, 2012, pp. 1-3.
Yukio Takada et al.; "Crystal and magnetic structures and their temperatures dependence of Co 2 Z-type hexaferrite (Ba, Sr) 3 Co 2 Fe 24 0 41 by high-temperature neutron diffraction"; Journal of Applied Physics, 100, Aug. 18, 2006, pp. 1-7.

* cited by examiner

*Primary Examiner* — C Melissa Koslow
(74) *Attorney, Agent, or Firm* — Arent Fox LLP

(57) ABSTRACT

A magnetoelectric effect material includes as a primary component, a polycrystalline oxide ceramic containing at least Sr, Co, and Fe. In the polycrystalline oxide ceramic, the crystal c-axis is oriented in a predetermined direction, and the degree of orientation of the c-axis is 0.2 or more by a Lotgering method. A component substrate is formed of this magnetoelectric effect material.

14 Claims, 7 Drawing Sheets

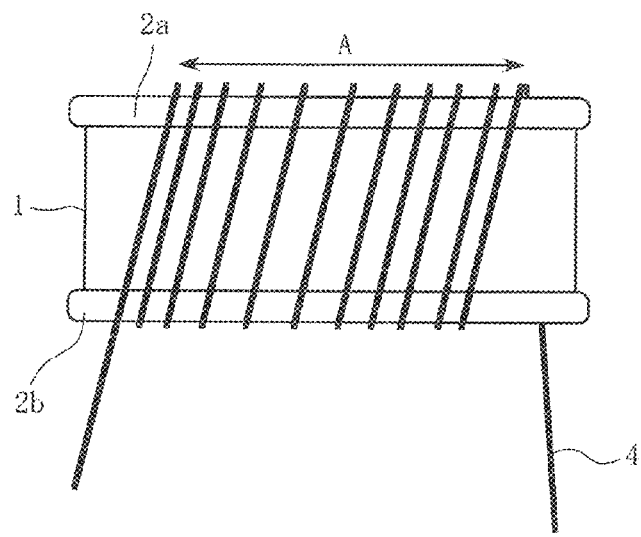
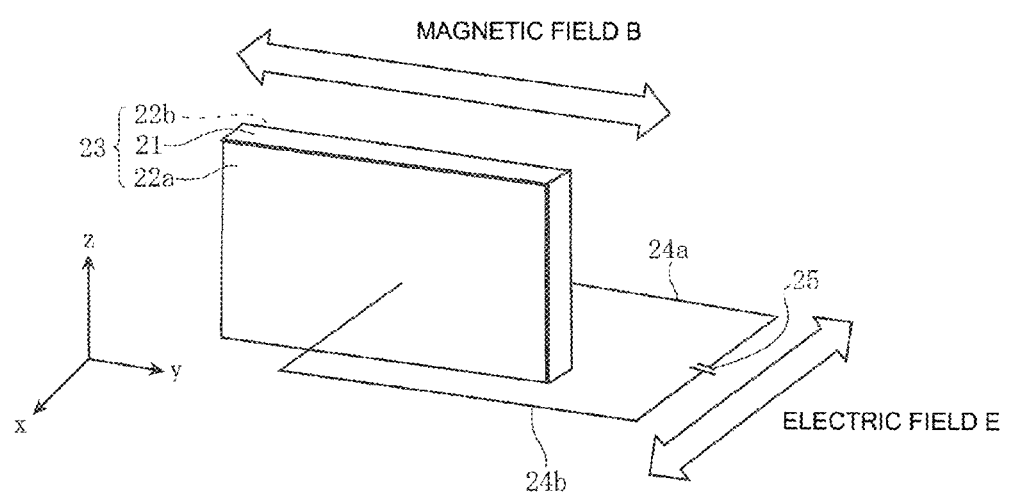

ELECTROMAGNETIC EFFECT MATERIAL AND CERAMIC ELECTRONIC COMPONENT

CROSS REFERENCE TO RELATED APPLICATIONS

The present application is a continuation of International application No. PCT/JP2014/056961, filed Mar. 14, 2014, which claims priority to Japanese Patent Application No. 2013-051557, filed Mar. 14, 2013, the entire contents of each of which are incorporated herein by reference.

FIELD OF THE INVENTION

The present invention relates to a magnetoelectric effect material and a ceramic electronic component and more particularly, relates to a magnetoelectric effect material formed from a ceramic material having a magnetoelectric effect and a ceramic electronic component, such as a variable inductor or a nonvolatile memory, using the magnetoelectric effect material described above.

BACKGROUND OF THE INVENTION

In recent years, attention has been paid to a ferromagnetic dielectrics (multiferroics) material which simultaneously has ferromagnetism and ferroelectricity and which exhibits a composite function, and research and development on this material has been aggressively carried out.

This ferromagnetic dielectric material has been known as a material having a so-called magnetoelectric effect in which when a magnetic field is applied, by induction of spiral magnetic ordering, the ferroelectricity is exhibited, so that the electric polarization is generated, or the electric polarization and/or the dielectric constant is changed, and in which when an electric field is applied, the magnetization is generated or is changed.

Since the ferromagnetic dielectric material can generate by the magnetoelectric effect described above, the change in magnetization by application of an electric field and the change in electric polarization by application of a magnetic field, this ferromagnetic dielectric material is expected to be applied to various ceramic electronic components, such as a variable inductor in which the magnetization is changed by application of an electric field, a variable magnetic device for a writing head of a memory medium, a magnetic sensor detecting magnetism, and a nonvolatile memory.

In particular, research and development of ferromagnetic dielectric materials exhibiting a "gigantic magnetoelectric effect" in which the electric polarization is significantly changed by application of a magnetic field has been actively carried out.

For example, Patent Document 1 has proposed a multiferroic element in which by application of an external magnetic field to a multiferroic solid material simultaneously having ferroelectricity and ferromagnetism that has a spin structure, the spin direction of which is rotated so as to be along the outer side of a corn (apex angle α of the top of the corn is in a range of $0°<\alpha\leq 90°$, the direction of the electric polarization approximately orthogonal to the external magnetic field described above is controlled.

In this Patent Document 1, by the use of $MCr_2O_4$ (M=Mn, Fe, Co, or Ni) as the ferromagnetic dielectric material (multiferroic material), the electric polarization is generated in an ultralow temperature region of approximately 26K by application of a magnetic field, and an electric polarization of 2 $\mu C/m^2$ is obtained at approximately 5K.

In addition, Patent Document 2 has also proposed a multiferroic element which is formed of a multiferroic solid material containing iron oxide as a primary raw material and simultaneously having ferroelectricity and ferromagnetism and which is designed to induce a current by application of a weak external magnetic field of 300 Gauss or less.

This Patent Document 2 has disclosed that when a ferrite compound of $Ba_2Mg_2Fe_{12}O_{22}$ is used as the ferromagnetic dielectric material (multiferroic material), and a low magnetic field of 300 Gauss (0.03 T) is applied thereto, a current flows at −268° C. (5K) corresponding to the application of an alternating magnetic field, and positive and negative electric polarizations are also alternately generated.

In addition, Patent Document 3 has proposed a magnetoelectric effect material which is formed of an oxide ceramic as a primary component represented by a general formula of $(Sr_{1-\alpha}Ba_\alpha)_3(Co_{1-\beta}B_\beta)_2Fe_{24}O_{41+\delta}$ (in the formula, B represents at least one type of element selected from the group consisting of Ni, Zn, Mn, Mg, and Cu, and α, β, and δ satisfy $0\leq\alpha\leq 0.3$, $0\leq\beta\leq 0.3$, and $-1\leq\delta\leq 1$, respectively) and which exhibits a magnetoelectric effect in a temperature range of 250K to 350K and a magnetic field range of 0.05 T (tesla) or less.

According to this Patent Document 3, when a ferromagnetic dielectric material having a hexagonal Z-type crystal structure represented by the above general formula is used, and when sweeping is performed in a magnetic field range of −0.05 to +0.05 T, a ferromagnetic dielectric material is obtained which has an electric polarization of 1.0 to 9.5 $\mu C/m^2$ and a magnetoelectric coupling factor of 100 ps/m to at most 470 ps/m at approximately room temperature and in a magnetic field range of 0.05 T or less.

Patent Document 1: International Publication No. 2007/135817 (claims 1 and 3, Paragraph No. [0031], FIG. 7, and the like)

Patent Document 2: Japanese Unexamined Patent Application Publication No. 2009-224563 (claims 1 and 3, Paragraph No. [0032], FIG. 7, and the like)

Patent Document 3: Japanese Unexamined Patent Application Publication No. 2012-1396 (claim 1, Paragraph Nos. [0010] and [0061], Table 3, FIG. 3, and the like)

SUMMARY OF THE INVENTION

Incidentally, when a ferromagnetic dielectric material is used for various electronic components, such as a variable inductor and a nonvolatile memory, the magnetoelectric effect is required to be exhibited in an allowable temperature range (such as 300K±50K) in which electronic devices are allowed to be used.

However, according the above Patent Documents 1 and 2, the magnetoelectric effect is exhibited only in a temperature region far lower than the above allowable temperature range for electronic devices and cannot be exhibited in the above allowable temperature range for electronic devices. Hence, various ceramic electronic components using the magnetoelectric effect are still difficult to be realized for practical use.

In addition, according to the above Patent Document 3, although a magnetoelectric coupling factor of up to 470 ps/m can be obtained at approximately room temperature by the use of a ferromagnetic dielectric material having a hexagonal Z-type crystal structure, the maximum value cannot be obtained at a substantially zero magnetic field (at a zero magnetic field or the vicinity thereof), and in order to obtain a large magnetoelectric coupling factor, a magnetic bias of approximately 5 to 10 mT is required. In addition, in this Patent Document 3, although a relatively large magnetoelectric coupling factor is obtained as described above, in order to realize a practical ceramic electronic component, development of a ferromagnetic dielectric material having a remarkably larger magnetoelectric coupling factor has been expected.

In consideration of the situations as described above, the present invention aims to provide a magnetoelectric effect material capable of exhibiting preferable ferromagnetic dielectric characteristics in an allowable temperature range in which in general, electronic devices are allowed to be used by application of a magnetic field and/or by application of an electric field and also to provide a ceramic electronic component, such as a variable inductor or a nonvolatile memory, using the magnetoelectric effect material described above.

Through intensive research performed using a polycrystalline oxide ceramic formed of a $Sr_3Co_2Fe_{24}O_{41}$— based compound which is believed as a promising ferromagnetic dielectric material, the present inventors found that when the crystal c-axis of the oxide ceramic described above is oriented and electrically polarized perpendicular to the crystal c-axis orientation, a magnetoelectric effect material can be realized which can exhibit preferable ferromagnetic dielectric characteristics in an allowable temperature range (such as 300K±50K) in which electronic devices are used by application of a low magnetic field.

In addition, although the $Sr_3Co_2Fe_{24}O_{41}$-based compound typically has a hexagonal Z-type crystal structure, it was found that even if a polycrystalline oxide ceramic having a crystal system lower than a hexagonal crystal system in terms of symmetry is used, when this oxide ceramic contains at least Sr, Co, and Fe in a primary component, and the crystal c-axis thereof is oriented and electrically polarized perpendicular to the crystal c-axis orientation, an effect similar to that described above can also be obtained.

The present invention was made based on the finding as described above. That is, the magnetoelectric effect material of the present invention is a magnetoelectric effect material which generates electric polarization by application of a magnetic field and generates magnetization by application of an electric field and which includes as a primary component, a polycrystalline oxide ceramic containing at least Sr, Co, and Fe, and the crystal c-axis of this oxide ceramic is oriented and electrically polarized perpendicular to the crystal c-axis orientation.

Furthermore, in the magnetoelectric effect material of the present invention, the oxide ceramic described above preferably contains at least one of Ba and at least one type of element selected from Ni, Zn, Mn, Mg, and Cu.

In addition, in the magnetoelectric effect material of the present invention, the primary component described above is preferably represented by a general formula of $(Sr_{1-\alpha}Ba_\alpha)_3(Co_{1-\beta}X_\beta)_2Fe_{24}O_{41+\delta}$ (where X represents at least one type of element selected from Ni, Zn, Mn, Mg, and Cu, $\alpha$, $\beta$, and $\delta$ satisfy $0 \leq \alpha \leq 0.4$, $0 \leq \beta \leq 0.3$, and $-1 \leq \delta \leq 1$, respectively).

In addition, in the magnetoelectric effect material of the present invention, the degree of orientation of the above c-axis is preferably 0.2 or more by a Lotgering method.

Accordingly, even in an allowable temperature range for electronic devices, a magnetoelectric effect material capable of exhibiting preferable ferromagnetic dielectric characteristics by applying a low magnetic field can be effectively obtained.

In addition, in the magnetoelectric effect material of the present invention, the crystal particles of the oxide ceramic preferably have an anisotropic shape.

Furthermore, in the magnetoelectric effect material of the present invention, the crystal particles are preferably formed so that the ratio of particle lengths in longitudinal directions to those in lateral directions is 2 or more, and the longitudinal directions are preferably aligned crystallographically in one direction.

In addition, in the magnetoelectric effect material of the present invention, the polarity of the magnetization is changed in accordance with the polarity of an electric field to be applied, and when the electric field is changed from an application state to a non-application state, the polarity of the magnetization which is changed as described above is preferably retained.

Furthermore, in the magnetoelectric effect material of the present invention, the intensity of the magnetization is preferably controllable in accordance with the intensity of an electric field to be applied.

In addition, in the case described above, the polarity of the magnetization is also changed in accordance with the polarity of an electric field to be applied, and when the electric field is changed from an application state to a non-application state, the polarity of the magnetization which is changed as described above is also preferably retained.

In addition, the magnetoelectric effect material of the present invention may be used in an allowable temperature range in which electronic devices are allowed to be used.

In addition, a ceramic electronic component of the present invention is a ceramic electronic component in which an external electrode is formed on a surface of a component substrate, and the component substrate is formed of any one of the magnetoelectric effect materials described above.

Furthermore, the ceramic electronic component of the present invention preferably includes at least one of a variable inductor, a nonvolatile memory, a voltage sensor, a magnetic sensor, and a magnetic switch.

The magnetoelectric effect material of the present invention is a magnetoelectric effect material which generates electric polarization by application of a magnetic field and generates magnetization by application of an electric field and which includes as a primary component, a polycrystalline oxide ceramic containing at least Sr, Co, and Fe, and the crystal c-axis of the oxide ceramic described above is oriented and electrically polarized perpendicular to the crystal c-axis orientation; hence, even when the magnetoelectric effect material of the present invention is used in an allowable temperature range in which in general, electronic devices are allowed to be used, a large electric polarization and/or magnetoelectric coupling factor can be obtained by applying a low magnetic field. That is, a magnetoelectric effect material can be obtained having preferable ferromagnetic dielectric characteristics in which a large current can be output in response to the magnetic field, and the magnetization (permeability) can be remarkably changed by application of an electric field.

The ceramic electronic component of the present invention is a ceramic electronic component in which an external electrode is formed on a surface of a component substrate, and the component substrate is formed of any one of the magnetoelectric effect materials described above; hence, a ceramic electronic component, such as a variable inductor or a nonvolatile memory, can be obtained which is capable of exhibiting a large magnetoelectric effect in an allowable temperature range in which in general, electronic devices are allowed to be used by application of a low magnetic field.

BRIEF DESCRIPTION OF THE DRAWINGS

FIG. 1 is a front view showing one embodiment of a ceramic electronic component formed using a magnetoelectric effect material of the present invention.

FIG. 2 is a perspective view schematically showing a polarization treatment device used in examples.

DETAILED DESCRIPTION OF THE PREFERRED EMBODIMENTS

Figure 3:
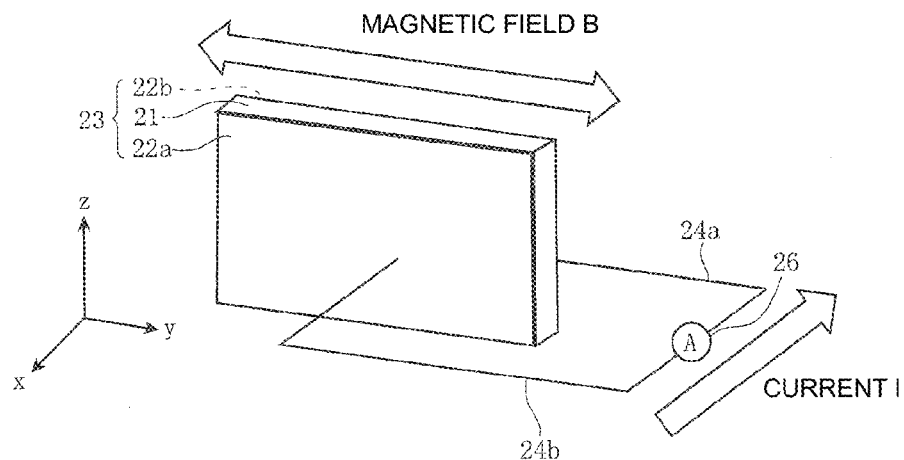
FIG. 3 is a perspective view showing the case in which a magnetoelectric current is measured by the above polarization treatment device.

A magnetoelectric effect material according to one embodiment of the present invention includes as a primary component, a polycrystalline oxide ceramic containing at least Sr, Co, and Fe. In addition, in the oxide ceramic described above, the crystal c-axis is oriented and electrically polarized perpendicular to the crystal c-axis orientation.

The primary component has a hexagonal Z-type crystal structure represented by the following general formula (A).

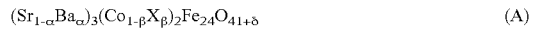

$$(Sr_{1-\alpha}Ba_\alpha)_3(Co_{1-\beta}X_\beta)_2Fe_{24}O_{41+\delta} \quad (A)$$

In the above formula, X represents at least one type of element selected from the group consisting of Ni, Zn, Mn, Mg, and Cu.

In addition, $\alpha$, $\beta$, and $\delta$ satisfy equations (1) to (3), respectively.

$$0 \le \alpha \le 0.4 \quad (1)$$

$$0 \le \beta \le 0.3 \quad (2)$$

$$-1 \le \delta \le +1 \quad (3)$$

That is, this oxide ceramic includes a $Sr_3Co_2Fe_{24}O_{41}$ (($SrO)_3(CoO)_2(Fe_2O_3)_{12}$) -based compound as a primary component, and if needed, also includes Ba which partially replaces Sr and an element X which partially replaces Co.

The reason $\alpha$ is set so as to satisfy the equation (1) is that when $\alpha$ is more than 0.4, since the content of Ba in the oxide ceramic becomes excessive, and the content of Sr is decreased, a desired large magnetoelectric effect may not be obtained in some cases even if the crystal c-axis is oriented and electrically polarized perpendicular to the crystal c-axis orientation.

As is the case described above, the reason $\beta$ is set so as to satisfy the equation (2) is that when $\beta$ is more than 0.3, since the content of the element X in the oxide ceramic becomes excessive, and the content of Co is decreased, a desired large magnetoelectric effect may not be obtained in some cases even if the crystal c-axis is oriented and electrically polarized perpendicular to the crystal c-axis orientation.

In addition, the reason $\delta$ is set so as to satisfy the equation (3) is that although $\delta$ represents "0" according to the stoichiometric composition, it is intended to allow the change thereof as long as the characteristics of the oxide ceramic are not adversely influenced, and $\delta$ is more preferably in a range of 0 to +1.

As disclosed in detail in Non-Patent Document 1, the hexagonal Z-type crystal structure described above has a complicated crystal structure in which three different types of blocks, an R block, an S block, and a T block, are laminated to each other in the order of R-S-T-S-R*-S*-T*-S*. In this structure, * indicates a block rotated by 180° with respect to the c-axis. For example, in the case of $Sr_3Co_2Fe_{24}O_{41}$, if the blocks are each defined by a chemical formula, the R block is formed of $[SrFe_6O_{11}]^{2-}$, the S block is formed of $Co_2^{2+}Fe_4O_8$, and the T block is formed of $Sr_2Fe_8O_{14}$. In addition, $Sr_3Co_2Fe_{24}O_{41}$ has a multilayer structure in which the blocks described above are laminated to have a laminate cycle in the order of R-S-T-S- - - - .

Non-Patent Document 1: authored by Robert C. Pullar, "Hexagonal Ferrites: A review of the synthesis, properties and applications of hexaferrite ceramics", Progress in Materials Science 57, 2012, pp. 1191-1334

As a promising ferromagnetic dielectric material which can simultaneously exhibit ferromagnetism and ferroelectricity, this $Sr_3Co_2Fe_{24}O_{41}$-based compound having a hexagonal Z-type crystal structure has drawn attention, and by the magnetoelectric effect, the electric polarization can be generated by application of a magnetic field, and the change in magnetization can also be generated by application of an electric field.

However, as disclosed in the above "Technical Problem", the $Sr_3Co_2Fe_{24}O_{41}$-based compound described above can exhibit a practically sufficient magnetoelectric effect only in a temperature region (such as 26K or less) far lower than an allowable temperature range (such as 300K±50K) in which in general, electronic devices are allowed to be used.

Accordingly, through intensive research carried out by the present inventors, it was found that in the oxide ceramic described above, when the crystal c-axis is oriented and electrically polarized perpendicular to the crystal c-axis orientation, even in the allowable temperature range described above, a magnetoelectric effect material capable of exhibiting preferable ferromagnetic dielectric characteristics can be obtained.

Although a method to orient the crystal c-axis is not particularly limited, for example, when a ceramic slurry formed in a manufacturing process is supplied to a mold having a predetermined shape, and the mold is then rotated while a predetermined static magnetic field (such as 0.4 to 0.5 T) is applied in one direction, the crystal orientation characteristic can be imparted to crystal particles.

The degree of this crystal orientation may be evaluated by a Lotgering method.

That is, the Lotgering method has been widely known as an index to evaluate the crystal orientation, and according to this Lotgering method, a crystal c-axis orientation degree Fc can be represented by the following equation (4).

[Eq. 4]

$$Fc = \frac{\frac{\Sigma I(00L)}{\Sigma I(hkl)} - \frac{\Sigma Io(00L)}{\Sigma Io(hkl)}}{1 - \frac{\Sigma Io(00L)}{\Sigma I(hkl)}} \quad (4)$$

In the above equation, $\Sigma I(00L)$ represents the sum of x-ray peak intensity of the crystal face (00L) orthogonal to the c-axis of an oriented sample, and $\Sigma I(hkl)$ represents the sum of x-ray peak intensities of all crystal faces (hkl) of the oriented sample. In addition, $\Sigma I_0(00L)$ represents the sum of x-ray peak intensity of the crystal face (00L) of a non-oriented sample, such as a standard sample, and $\Sigma I_0(hkl)$ represents the sum of x-ray peak intensities of all crystal faces (hkl) of the standard sample.

In this embodiment, although the c-axis orientation degree Fc is not particularly limited as long as the crystal c-axis is oriented and electrically polarized perpendicular to the crystal c-axis orientation, in order to obtain a larger magnetoelectric effect, the c-axis orientation degree Fc is preferably 0.2 or more and more preferably 0.6 or more.

In addition, although the shape of the crystal particle is not particularly limited, the crystal particles preferably have an anisotropic shape. In particular, an aspect ratio a/b of a longitudinal particle length a to a lateral particle length b is preferably 2 or more, more preferably 5 or more, and further preferably 10 or more.

In addition, the longitudinal directions of the crystal particles are preferably crystallographically aligned in one direction. In this case, "the longitudinal directions are crystallographically aligned in one direction" indicates the state in which 80% or more of the crystal particles form an acute angle in a range of −30° to +30° therebetween in the longitudinal directions thereof, and when the longitudinal directions of the crystal particles are crystallographically aligned in one direction as described above, a desired magnetoelectric effect can be easily exhibited.

The shape of the crystal particles and the degree of alignment thereof in the longitudinal directions can be confirmed by observing a cross-sectional surface of the oxide ceramic and electrically polarized perpendicular to the crystal c-axis orientation using a laser microscope or the like. For example, when a cross-section surface orthogonal to the orientation direction of the c-axis is observed by a laser microscope, the shape anisotropy of the crystal particles can be confirmed. In addition, when a cross-sectional surface along the orientation direction of the c-axis is observed, the degree of alignment of the crystal particles in the longitudinal directions can be confirmed.

As described above, in this embodiment, since the crystal c-axis of the oxide ceramic described above is oriented and electrically polarized perpendicular to the crystal c-axis orientation, even in an allowable temperature range in which in general, electronic devices are allowed to be used, a magnetoelectric effect material capable of exhibiting preferable ferromagnetic dielectric characteristics can be obtained by applying a low magnetic field.

In particular, a gigantic magnetoelectric effect having an electric polarization P of 15 μC/m² or more induced by application of a magnetic field and/or a magnetoelectric coupling factor of $4.0 \times 10^{-10}$ s/m or more can be exhibited.

That is, in a ferromagnetic dielectric material exhibiting a magnetoelectric effect, since the electric polarization P is induced when spiral magnetic ordering is generated, the electric polarization P and the magnetic ordering have a close correlation therebetween, and as shown in an equation (5), when the change in electric polarization P with the change in magnetic field B is defined as a magnetoelectric coupling factor α, the ferromagnetic dielectric characteristics can be evaluated by the magnetoelectric coupling factor α.

$$\alpha = \mu_0(dP/dB) \quad (5)$$

In the above equation, $\mu_0$ represent a vacuum permeability ($=4\pi \times 10^{-7}$ H/m).

In addition, a current density J of a magnetoelectric current I is represented by an equation (6).

$$J = dP/dt \quad (6)$$

Accordingly, when the current density J of the magnetoelectric current I is integrated with a time t, the electric polarization P can be obtained.

In addition, the change in electric polarization P with the change in magnetic field B can be represented by an equation (7).

$$dP/dB = (dP/dt)/(dB/dt) = J/(dB/dt) \quad (7)$$

In this equation, dB/dt represents a sweeping rate of the magnetic field B.

When the above equation (5) is substituted into the equation (7), the magnetoelectric coupling factor α can be represented by an equation (8).

$$\alpha = (\mu_0 \cdot J)/(dB/dt) \quad (8)$$

Accordingly, the magnetoelectric coupling factor α can be obtained by dividing the product of the vacuum permeability $\mu_0$ and the current density J by the sweeping rate (dB/dt) of the magnetic field.

As apparent from the equation (8), the magnetoelectric coupling factor α is increased as the current density J of the magnetoelectric current I is increased, and hence, the magnetoelectric coupling factor α is increased as the rate of change in electric polarization P is increased. As a result, a gigantic magnetoelectric effect can be obtained, and a ferromagnetic dielectric can be realized.

In addition, in this magnetoelectric effect material, when the crystal c-axis of the oxide ceramic is oriented and electrically polarized perpendicular to the crystal c-axis orientation as described above, a magnetoelectric effect material having preferable ferromagnetic dielectric characteristics can be obtained in an allowable temperature range for electronic devices by application of a low magnetic field. The magnetoelectric effect material thus obtained has an electric polarization P of 15 μC/m² or more, preferably 20 μC/m² or more, more preferably 23 μC/m² or more, and further preferably 26 μC/m² or more, and/or has a magnetoelectric coupling factor α of $4.0 \times 10^{-10}$ s/m or more, preferably $1.0 \times 10^{-9}$ s/m or more, and more preferably $1.5 \times 10^{-9}$ s/m or more.

In addition, in this magnetoelectric effect material, although the primary component contains at least Sr, Co, and Fe as described above, the content of the primary component in the magnetoelectric effect material described above may be at least 70 percent by weight or more, preferably 80 percent by weight or more, and more preferably 90 percent by weight or more.

In the magnetoelectric effect material of the present invention, the polarity of the magnetization M is changed in accordance with the polarity of an electric field E to be applied, and in addition, when the electric field is changed from an application state to a non-application state, the polarity of the magnetization changed as described above can be retained.

For example, in the case of the hexagonal Z-type oxide ceramic described above, negative magnetization (− magnetization) is generated when a positive electric field (+ electric field) is applied, and in this state, when the electric field is set to zero (non-application state), although the magnetization M closes "0", the polarity thereof is not reversed, and the negative magnetization is retained. In contrast, positive magnetization (+ magnetization) is generated when a negative electric field (− electric field) is applied, and in this state, when the electric field is set to zero (non-application state), although the magnetization M closes "0", the polarity thereof is not reversed, and the positive magnetization is retained.

In addition, in the magnetoelectric effect material of the present invention, in accordance with the intensity of an electric field E to be applied, the intensity of the magnetization M can be controlled. In addition, in this case, the polarity of the magnetization M is also changed in accordance with the polarity of an electric field E to be applied, and when the electric field is changed from an application state to a non-application state, the polarity of the magnetization changed as described above can be retained.

For example, in the case of the hexagonal Z-type oxide ceramic described above, a first positive magnetization is generated by application of a first negative electric field, and in this state, even if the electric field is set to zero (non-application state), the polarity of the magnetization is not reversed, and the positive magnetization is retained as described above. In addition, the polarity of the magnetization is reversed to a negative side by application of a positive electric field, and even if the electric field is set to zero, the polarity of the magnetization is not reversed, and the negative magnetization is retained. Subsequently, when a second negative electric field having an intensity different from that of the above first negative electric field is applied, and in this state, when the electric field is set to zero (non-application state), the polarity of the magnetization is not reversed, and a second positive magnetization different from the first positive magnetization is retained.

That is, the intensity of the magnetization can be controlled in a stepwise manner in accordance with the intensity of an electric field to be applied, and even if the electric field is set to zero, the same polarity as that of the magnetization generated by application of the electric field is retained.

The reason the polarity of the magnetization is not changed even if the electric field is changed from an application state to a non-application state, and the polarity obtained in the application state can be retained is inferred that since a strong correlation between the ferroelectricity and the ferromagnetism is present, the magnetization of the oxide ceramic is changed in accordance with the intensity of an electric field to be applied, and the change in magnetization has a hysteresis with respect to a sweeping direction of the electric field. That is, it is believed that although different magnetization is generated in accordance with the intensity of an electric field to be applied, since having a hysteresis, the magnetization is not completely erased even at a zero electric field, and a remnant magnetization is generated, so that a hysteresis phenomenon occurs in which the change in magnetization as described above has a hysteresis with respect to the sweeping direction of the electric field.

In addition, although the electric resistivity of this magnetoelectric effect material is not particularly limited, in order to ensure preferable insulating characteristics, in an allowable temperature range for electronic devices, the electric resistivity is preferably $1.0 \times 10^8$ Ω·cm or more, more preferably $1.0 \times 10^9$ Ω·cm or more, and further preferably $2.0 \times 10^9$ Ω·cm or more.

As described above, in this embodiment, the primary component is formed of an oxide ceramic containing at least Sr, Co, and Fe, and in this oxide ceramic, the crystal c-axis is oriented and electrically polarized perpendicular to the crystal c-axis orientation. Hence, even if used in an allowable temperature range in which in general, electronic devices are allowed to be used, a magnetoelectric effect material having preferable ferromagnetic dielectric characteristics can be obtained. In this magnetoelectric effect material, a large electric polarization and/or magnetoelectric coupling factor can be obtained by a low magnetic field, and hence, a large current can be output in response to the magnetic field, and the magnetization or the permeability can be remarkably changed by the electric field. In particular, a magnetoelectric effect material can be obtained having preferable ferromagnetic dielectric characteristics in which the electric polarization P is 15 μC/m² or more and/or the magnetoelectric coupling factor α is $4.0 \times 10^{-10}$ s/m or more.

In the embodiment described above, although the oxide ceramic having a hexagonal Z-type structure with a lamination cycle in which the R block, the S block, and the T block are laminated to each other has been described in detail, a crystal system having a low crystal symmetry, such as a crystal system in which the lamination cyclic structure is partially destroyed, as compared to that the hexagonal crystal system may also be used.

In addition, there may also be used a crystal system in which an ion coordinated at a predetermined atomic position of a crystal lattice is slightly shifted therefrom and which has a low crystal symmetry as compared to that of a hexagonal crystal system. For example, in a hexagonal Z-type crystal structure, ions, such as $O^{2-}$ and $Co^{2+}$, forming a crystal are coordinated at predetermined atomic positions defined by a space group of $P6_3/mmc$, the space group describing the crystal symmetry. Hence, the present invention may also be applied to a crystal structure in which the ions described above are shifted from the above predetermined atomic positions and are coordinated at atomic positions defined by a different space group, and in which the crystal symmetry is lower than that of a hexagonal crystal system.

That is, in this oxide ceramic, it is important that the crystal c-axis of an oxide ceramic containing at least Sr, Co, and Fe is oriented and electrically polarized perpendicular to the crystal c-axis orientation, and hence, even by a crystal system having a crystal symmetry lower than that of a hexagonal crystal system, the desired object of the present invention can also be achieved.

Next, a method for manufacturing this magnetoelectric effect material will be described in detail.

First, as ceramic raw materials, an Fe compound such as $Fe_2O_3$, an Sr compound such as $SrCO_3$, and a Co compound such as $Co_3O_4$ are prepared together with, if needed, a Ba compound such as $BaCO_3$ and an X compound containing an element X.

Next, those ceramic raw materials were weighed so that the above general formula (A) satisfies the equations (1) to (3).

Subsequently, the ceramic raw materials thus weighed were charged into a pulverizer, such as a pot mill, together with pulverizing media, such as partially stabilized zirconium (hereinafter referred to as "PSZ") balls, a dispersant, and a solvent, such as water, and were sufficiently pulverized and mixed together, so that a mixture is obtained.

Next, after being dried and granulated, the above mixture is calcined in an air atmosphere at a temperature of 1,000° C. to 1,100° C. for a predetermined time and is then cooled to room temperature. Subsequently, pulverization is performed, so that a calcined powder is obtained.

Next, after this calcined powder is fired in an air atmosphere at a temperature of 1,150° C. to 1,250° C. for a predetermined time and are then cooled to room temperature to form a ceramic sintered body. Subsequently, this ceramic sintered body is pulverized, so that a ceramic powder is obtained.

In this step, although the powder particle diameter of this ceramic powder is not particularly limited, in order to obtain preferable orientation, the particle diameter is preferably decreased as small as possible, and the median diameter $D_{50}$ is preferably 8 µm or less, more preferably 4 µm or less, and further preferably 2 µm or less.

Next, this ceramic powder is again charged into a pulverizer together with an organic binder, such as a poly(vinyl alcohol) (hereinafter referred to as "PVA"), and an organic solvent, such as purified water, and is then sufficiently pulverized and mixed together, so that a ceramic slurry is obtained.

Next, after this ceramic slurry is supplied in a mold having a predetermined shape, the mold is rotated while the crystal orientation is imparted by applying a static magnetic field of 0.4 to 0.5 T in one direction, and the pressure is further applied to an axial core direction of a rotation shaft of the mold for dehydration. Subsequently, the pressure is applied in a non-magnetic field to obtain a ceramic molded body.

Next, this ceramic molded body is again fired in an air atmosphere or an oxygen atmosphere at a temperature of 1,100° C. to 1,300° C. for approximately 10 to 20 hours and is then left in an oxygen atmosphere at a temperature of 800° C. to 1,100° C. for approximately 1 to 50 hours. Subsequently, cooling is performed to room temperature for approximately 2 to 100 hours, so that a magnetoelectric effect material can be formed.

As described above, since the firing is performed again, and the molded body is maintained for a predetermined time and then cooled, the electric resistivity can be increased.

Next, a ceramic electronic component using this magnetoelectric effect material will be described.

FIG. 1 is a front view showing one embodiment of a variable inductor as the ceramic electronic component of the present invention.

This variable inductor includes a component substrate 1 formed of the above oxide ceramic and external electrodes 2a and 2b formed at two end portions of the component substrate 1.

In addition, this variable inductor also includes a coil so as to enable a magnetic flux to pass through the component substrate 1 when a high frequency signal flows. In particular, in this embodiment, a coil 4 formed of an electrically conductive material, such as Cu, is wound around so as to hold the external electrodes 2a and 2b.

In addition, as an electrode material forming the external electrodes 2a and 2b, any material may be used as long as having a good electrical conductivity, and for example, various types of metal materials, such as Pd, Pt, Ag, Ni, and Cu, may be used.

In this variable inductor formed as described above, since the component substrate 1 is formed of the magnetoelectric effect material described above, and the coil 4 is wound around so as to hold the external electrodes 2a and 2b, when a high frequency signal is input to the coil 4, a magnetic flux generated in an arrow A direction is allowed to pass through the component substrate 1, and the inductance is obtained in accordance with the number of turns of the coil, the element shape, and the permeability of the component substrate 1. In addition, when an electric field (voltage) is applied to the external electrodes 2a and 2b, the change in magnetization (change in permeability) is generated by the magnetoelectric effect, and an inductance L of the coil can be changed. In addition, when the electric field (voltage) is changed, the rate of change ΔL in inductance L can be controlled.

The variable inductor described above may also be manufactured as described below.

That is, in the step of forming a magnetoelectric effect material described above, although the crystal orientation is imparted to the ceramic slurry supplied in the mold in a rotational magnetic field, for example, when a ceramic slurry prepared by adding a ceramic powder and an organic binder to an organic solvent is formed into a sheet in a rotational magnetic field, a ceramic green sheet to which the crystal orientation is imparted may also be formed. In addition, when an internal electrode is formed if needed, a structure in which the voltage is more efficiently applied to a variable inductor can be formed.

As described above, in this embodiment, when the electric field is applied, the magnetization (permeability) can be changed, and hence, the inductance L of the coil can be changed. Furthermore, when an electric field to be applied is adjusted, the rate of change in inductance L can be controlled, so that a highly reliable variable inductance can be obtained.

Furthermore, since having preferable ferromagnetic dielectric characteristics in an allowable temperature range in which in general, electronic devices can be used, the above magnetoelectric effect material may be applied to, besides the variable inductor described above, various types of ceramic electronic components, such as a nonvolatile memory, a voltage sensor, a magnetic sensor, and a magnetic switch.

For example, when the direction of the magnetization of the above magnetoelectric effect material is controlled by the voltage, two types of information, that is, "0" and "1", are stored, so that this ceramic electronic component can be used as a nonvolatile memory. That is, the thickness of the magnetoelectric effect material is reduced to form a thin-film substrate, electrodes are formed on two main surfaces thereof, and a tunnel magnetoresistive element is disposed on surfaces of the electrodes. In addition, when the voltage is applied to the electrodes, the polarity of the magnetization of the thin-film substrate can be reversed, and hence, in accordance with this polarity reversal of the magnetization, the resistance of the tunnel magnetoresistive element is also changed. In addition, even if the voltage application is blocked to form a non-application state, since the polarity of the magnetization of the magnetoelectric effect material is not changed and is retained, the resistance of the tunnel magnetoresistive element can also be retained, so that the information can be stored.

In addition, when the voltage is applied, by the change in magnetization, the voltage can be sensed, and hence, this magnetoelectric effect material can also be used as a voltage sensor.

Furthermore, this magnetoelectric effect material may also be used as a low power consumption and highly sensitive magnetic sensor. That is, after this magnetoelectric effect material is formed into a thin-film substrate, two electrodes are formed on two facing main surfaces of the thin-film substrate, and a current output from the electrodes or a voltage of a resistor connected to the thin-film substrate in series is measured. When the magnetic field is applied, since the current is output by the magnetoelectric effect, if the current thus output is directly measured, or the voltage is measured through the resistor connected in series, the presence or absence of application of the magnetic field and the intensity thereof can be measured. In addition, since the magnetic sensor thus formed is a low power consumption type, this magnetic sensor can be expected for applications, such as a magnetic sensor of a reading head of a hard disc drive and an opening/closing sensor of a notebook personal computer or a folding type mobile phone in combination with a permanent magnet.

In addition, by the use of the polarity reversal of the magnetization, the magnetoelectric effect material may also be used as a magnetic switch. For example, after the magnetoelectric effect material is formed into a thin-film substrate, electrodes are formed on two main surfaces of the thin-film substrate, and a polarization treatment is then performed, so that the polarity of the magnetization in a direction orthogonal to an application direction of the electric field can be changed. That is, by the polarity reversal of the electric field, the magnetic pole of one end surface of the thin-film substrate can be changed to an S or an N polar, and by the use of this change, information can be written on a magnetic memory medium, so that the magnetoelectric effect material can be used for a magnetic switch functioning as a switching element.

In addition, the present invention is not limited to the above embodiments, and it is to be naturally understood that the present invention may be variously changed and modified without departing from the scope of the present invention.

Next, examples of the present invention will be described in detail. However, the present invention is not limited to the following examples.

EXAMPLES

[Formation of Sample]
(Sample Nos. 1 to 16)

First, after a $SrCO_3$ powder, a $Co_3O_4$ powder, and a $Fe_2O_3$ powder were prepared as ceramic raw materials and were weighed so that a composition of $Sr_3Co_2Fe_{24}O_{41}$ was obtained after firing, mixing thereof was performed in an agate mortar, so that a mixed powder was obtained. Next, after this mixed powder was calcined in an air atmosphere at a temperature of 1,000° C. for 10 hours, cooling was then performed to room temperature, and mixing was performed by stirring in an agate mortar, so that a powdered sample was obtained. Subsequently, after this powdered sample was fired in an air atmosphere at a temperature of 1,160° C. to 1,190° C. for 10 to 15 hours, cooling was performed to room temperature over 19 hours, so that a ceramic sintered body was obtained.

Subsequently, this ceramic sintered body was pulverized by a ball mill, so that a ceramic powder was obtained.

The particle size distribution of the ceramic powder thus obtained was measured using a laser diffraction/scattering particle size distribution measurement apparatus (manufactured by Horiba, Ltd., La-0920), and a median diameter $D_{50}$ of 4 μm or less was confirmed.

Next, 2 to 3 g of the ceramic powder was added to and mixed with 1 to 2 mL of purified water prepared to contain 3 to 10 percent by weight of a PVA, so that a ceramic slurry of each of Sample Nos. 1 to 16 was formed.

Subsequently, after this ceramic slurry was supplied in a superalloy-made mold, the mold was rotated for 5 minutes while a static magnetic field of approximately 0.4 to 0.5 T was applied in one direction, and the pressure was simultaneously applied to an axial core direction of a rotation shaft for a dehydration treatment, so that the crystal orientation was imparted. Next, a pressure of 10 MPa was applied in a non-magnetic field, so that a ceramic molded body of each of Sample Nos. 1 to 16 was formed.

Subsequently, this ceramic molded body was again fired in an air atmosphere at a temperature of 1,185° C. for 15 hours and was then held in an oxygen atmosphere at a holding temperature of 1,000° C. for 24 hours. Next, cooling was performed to room temperature over 48 hours, so that a sample of each of Sample Nos. 1 to 16 was obtained. The exterior dimensions of the sample thus obtained were 10 mm in length, 10 mm in width, and 10 mm in thickness.

(Sample No. 17)

First, after a $BaCO_3$ powder was prepared as a ceramic raw material besides a $SrCO_3$ powder, a $Co_3O_4$ powder, and a $Fe_2O_3$ powder, those powders were weighed so that a composition of $Sr_{2.6}Ba_{0.4}Co_2Fe_{24}O_{41}$ was obtained after firing. Subsequently, a ceramic powder of Sample No. 17 was formed by a method and a procedure similar to those of Sample Nos. 1 to 16 except that the firing temperature was set to 1,220° C.

Subsequently, 3 g of this ceramic powder was added to and mixed with 2 mL of purified water prepared to contain 1 percent by weight of a PVA, so that a ceramic slurry of Sample No. 17 was formed.

Subsequently, except that the holding temperature after re-firing was set to 1,130° C., a sample of Sample No. 17 was formed by a method and a procedure similar to those of Sample Nos. 1 to 16.

(Sample No. 18)

After a mixed powder obtained by a method similar to that of Sample Nos. 1 to 16 was calcined in an air atmosphere at a temperature of 1,000° C. for 16 hours, cooling was performed to room temperature, and the mixture thus obtained was stirred and mixed together in an agate mortar. Subsequently, this powder sample was enclosed in a rubber balloon and was pressed at a hydrostatic pressure of 40 MPa, so that a cylindrical ceramic molded body having a diameter of approximately 5 mm and a length of approximately 30 mm was formed.

Next, after this ceramic molded body was fired in an oxygen atmosphere at a temperature of 1,180° C. for 16 hours, cooling was performed to room temperature over 19 hours, so that a non-oriented sample (ceramic powder) of Sample No. 18 was obtained.

(Sample No. 19)

Except that the firing temperature was set to 1,170° C., a non-oriented sample (ceramic powder) of Sample No. 19 was obtained by a method and a procedure similar to those of Sample Nos. 1 to 18.

In addition, the median diameter $D_{50}$ of the sample of Sample No. 19 measured by a method and a procedure similar to those of Sample Nos. 1 to 16 was approximately 5 μm.

(Sample No. 20)

First, after a $BaCO_3$ powder, a $Co_3O_4$ powder, and a $Fe_2O_3$ powder were prepared as ceramic raw materials and were weighed so that a composition of $Ba_3Co_2Fe_{24}O_{41}$ was obtained after firing, mixing thereof was performed in an agate mortar, so that a mixed powder was obtained. Next, after this mixed powder was calcined in an air atmosphere at a temperature of 1,000° C. for 10 hours, cooling was performed to room temperature. Subsequently, this powder sample was enclosed in a rubber balloon and was pressed at a hydrostatic pressure of 40 MPa, so that a cylindrical ceramic molded body having a diameter of approximately 5 mm and a length of approximately 30 mm was formed.

Subsequently, firing was performed in an air atmosphere at a temperature of 1,300° C. for 15 hours, and cooling was then performed to room temperature over 10 hours, so that a ceramic sintered body was obtained. Next, this ceramic sintered body was pulverized by a ball mill, so that a ceramic powder was obtained.

Next, it was confirmed that the median diameter $D_{50}$ obtained by measurement of the particle size distribution by a method and a procedure similar to those of Sample Nos. 1 to 16 was 4 μm or less.

Next, 2 g of the ceramic powder was added to and mixed with 2 mL of purified water prepared to contain 5 percent by weight of a PVA, so that a ceramic slurry of Sample No. 20 was formed.

Subsequently, a ceramic molded body of Sample No. 20 was formed by a method and a procedure similar to those of Sample Nos. 1 to 16.

Subsequently, this ceramic molded body was again fired in an air atmosphere at a temperature of 1,300° C. for 15 hours and was then held in an oxygen atmosphere at a holding temperature of 1,100° C. for 24 hours. Next, cooling was performed to room temperature over 48 hours, so that a sample of Sample No. 20 was obtained. The exterior dimensions of the sample thus obtained were 10 mm in length, 10 mm in width, and 10 mm in thickness.

[Measurement of Sample Characteristics]

The primary component composition and the crystal structure of the sample of each of Sample Nos. 1 to 20 were identified, the c-axis orientation degree Fc, the electric resistivity ρ, the electric polarization P, and the magnetoelectric coupling factor α thereof were measured, and furthermore, the presence or absence of induction of the electric polarization P, and the presence or absence of the polarity reversal of the magnetization M were measured, so that the characteristics of each sample were evaluated.

For the identification of the primary component, a composition analysis was performed using an inductively coupled plasma emission spectroscopic method (ICP) and a fluorescent x-ray analytical method (XRF). In addition, the crystal structure was identified using a fluorescent x-ray analytical method.

In addition, according to the Lotgering method, since represented by the equation (4), the c-axis orientation degree Fc was obtained from an x-ray diffraction spectrum. In this case, as the standard sample, the non-oriented sample of Sample No. 18 was used.

[Eq. 4]

$$Fc = \frac{\frac{\Sigma I(00L)}{\Sigma I(hkl)} - \frac{\Sigma Io(00L)}{\Sigma Io(hkl)}}{1 - \frac{\Sigma Io(00L)}{\Sigma I(hkl)}} \quad (4)$$

Since the ceramic raw materials used in this case each had a low vapor pressure, if preparation thereof was performed, for example, after the water absorption of each raw material was investigated in advance, a ceramic sintered body having a desired composition could be reproducibly obtained.

The electric resistivity ρ was obtained by a two-terminal method using an electrometer (manufactured by Keithley Instruments Inc., Unites States, 6517A).

Next, the sample of each of Sample Nos. 1 to 18 and 20 was cut into a thin film to form a thin-film substrate, and Ag was deposited on two main surfaces of the thin-film substrate to form surface electrodes, so that a measurement sample for characteristic evaluation was formed.

In addition, by the use of this measurement sample, the presence or absence of induction of the electric polarization P, the electric polarization P, the electric polarization P, and the magnetoelectric coupling factor α were measured.

FIG. 2 is a perspective view of a polarization treatment device schematically showing the direction of the electric field and that of the magnetic field in a polarization treatment, and in this FIG. 2, the case in which the application direction of the electric field is orthogonal to that of the magnetic field is shown.

That is, in this polarization treatment device, signal lines 24a and 24b are connected to a measurement sample 23 which is formed of a thin-film substrate 21 and surface electrodes 22a and 22b formed from Ag thin films and provided on two main surfaces of the substrate 21, and a direct current power source 25 is provided between the signal line 24a and the signal line 24b.

In addition, the measurement sample 23 is arranged so that when the axial core direction of the rotation shaft of the mold in orientation impartment, the thickness direction of the measurement sample 23, and the longitudinal direction thereof are each represented by a z axis, an x axis, and a y axis, respectively, an electric field E is applied in parallel with the x axis, and a magnetic field B is applied in parallel with the y axis.

In addition, a polarization treatment was performed in such a way that after a magnetic field B of −5 T was applied to the measurement sample 23 in a y axis direction, in this state, an electric field E of 1 MV/m was applied in an x axis direction, and while this electric field E was applied, the applied magnetic field was decreased to −0.5 T, and the electric field E and the magnetic field B were each then placed in a non-application state.

Next, as shown in FIG. 3, instead of using the direct current power source 25, an electrometer 26 (manufactured by Keithley Instruments Inc., United States, 6517A) was provided between the signal line 24a and the signal line 24b.

In addition, while the temperature was controlled at 300K using a low temperature cryostat (manufactured by Toyo Corp., LN—Z type), the magnetic field was swept at a rate of 1 T/min in a magnetic field range of −3 T to +3 T using the above superconducting magnet, so that a charge ejected from the measurement sample 23, that is, the magnetoelectric current I, was measured by the electrometer 26.

Since the current density J of the magnetoelectric current I is represented by the equation (6), the current density J was integrated with the time, so that the electric polarization P was obtained.

$$J = dP/dt \quad (6)$$

In addition, since the magnetoelectric coupling factor α is represented by the equation (8), the magnetoelectric coupling factor α was obtained from the current density J and the sweeping rate.

$$\alpha = (\mu_0 \cdot J)/(dB/dt) \quad (8)$$

In the above equation, $\mu_0$ represents $4\pi \times 10^{-7}$.

Subsequently, by appropriately rotating the measurement sample 23, the electric polarization P and the magnetoelectric coupling factor α were also obtained in the cases in each of which the application direction of the magnetic field B was in parallel with the x axis or the z axis.

As is the case described above, after the measurement sample 23 was cut so that the surface thereof orthogonal to the z axis was large and was disposed so that the application direction of the electric field E was in parallel with the z axis of the measurement sample 23, the electric polarization P and the magnetoelectric coupling factor α were also obtained in the cases in each of which the application direction of the magnetic field B was in parallel with the x axis direction, the y axis direction, or z axis direction of the measurement sample 23.

In addition, a sample in which the electric polarization P was induced in a magnetic field range of −2 T to +2 T was evaluated as "Yes", and a sample in which the electric polarization P was not induced was evaluated as "No".

Next, the presence or absence of the polarity reversal of the magnetization M of the sample of each of Sample Nos. 1 to 5, 13, 14, 17, 18, and 20 was investigated using a commercially available magnetization measurement apparatus.

That is, after a cycle in which the magnetization M was measured by application of an electric field E of +2 MV/m, was then measured at a zero electric field (non-application state), was next measured after 30 seconds passed, by application of an electric field of −2 MV/m, and was further measured again at a zero electric field was repeatedly performed several times, the polarity of the magnetization M with respect to the application of the electric field E was confirmed.

In addition, in the case in which after an electric field of +2 MV/m was applied, the electric field was set to zero and the case in which after an electric field of −2 MV/m was applied, the electric field was set to zero, if the polarity of the magnetization M was reversed from a positive side to a negative side or from a negative side to a positive side, the polarity reversal of the magnetization M was evaluated as "Yes", and when the polarity of the magnetization M was not reversed, the polarity reversal was evaluated as "No".

In addition, electric fields having different intensities were successively applied, and the change in magnetization M was investigated. That is, after an electric field E of −2.0 MV/m was applied, the electric field was set to zero and was held for approximately 10 seconds, and subsequently, after an electric field E of +2.0 MV/m was applied, the electric field was set to zero and was held for approximately 10 seconds. Next, as in the case described above, different electric fields E of −1.67 MV/m, −1.17 MV/m, −0.67 MV/m, and 0.33 mV/m were successively applied, and the relationship between the electric field E and the magnetization M was investigated.

Table 1 shows manufacturing conditions of the sample of each of Sample Nos. 1 to 20.

In addition, Table 2 shows the measurement results of the sample of each of Sample Nos. 1 to 20 in the state shown in FIG. 2, that is, in the state in which the application direction of the magnetic field B is orthogonal to the direction of the electric polarization P (B⊥P), the application direction of the magnetic field B is in parallel with the y axis (B//y), and the electric polarization P is in parallel with the x axis (P//x)). In Table 2, the electric polarization P and the magnetoelectric coupling factor α represent the peak values of the electric polarization characteristics and the magnetoelectric coupling factor characteristics, respectively, which will be described later.

TABLE 1

| | Ceramic Powder | | Ceramic Slurry | | | | |
|---|---|---|---|---|---|---|---|
| Sample No. | Primary Component Composition | Firing Temperature (° C.) | Powder Weight (g) | Water Volume (mL) | PVA Content in Water (wt %) | Intensity of Static Magnetic Field (T) | Holding Temperature (° C.) |
| 1 | $Sr_3Co_2Fe_{24}O_{41}$ | 1170 | 3 | 2 | 3 | 0.4 | 1000 |
| 2 | $Sr_3Co_2Fe_{24}O_{41}$ | 1170 | 3 | 2 | 3 | 0.4 | 1000 |
| 3 | $Sr_3Co_2Fe_{24}O_{41}$ | 1170 | 3 | 2 | 3 | 0.4 | 1000 |
| 4 | $Sr_3Co_2Fe_{24}O_{41}$ | 1170 | 3 | 2 | 3 | 0.4 | 1000 |
| 5 | $Sr_3Co_2Fe_{24}O_{41}$ | 1180 | 2 | 2 | 5 | 0.4 | 1000 |
| 6 | $Sr_3Co_2Fe_{24}O_{41}$ | 1165 | 3 | 2 | 3 | 0.4 | 1000 |
| 7 | $Sr_3Co_2Fe_{24}O_{41}$ | 1165 | 3 | 2 | 3 | 0.4 | 1000 |
| 8 | $Sr_3Co_2Fe_{24}O_{41}$ | 1160 | 3 | 2 | 3 | 0.4 | 1000 |
| 9 | $Sr_3Co_2Fe_{24}O_{41}$ | 1165 | 3 | 2 | 3 | 0.4 | 1000 |
| 10 | $Sr_3Co_2Fe_{24}O_{41}$ | 1160 | 3 | 2 | 3 | 0.4 | 1000 |
| 11 | $Sr_3Co_2Fe_{24}O_{41}$ | 1160 | 3 | 2 | 3 | 0.4 | 1000 |
| 12 | $Sr_3Co_2Fe_{24}O_{41}$ | 1160 | 3 | 2 | 3 | 0.4 | 1000 |
| 13 | $Sr_3Co_2Fe_{24}O_{41}$ | 1190 | 2 | 1 | 7 | 0.4 | 1000 |
| 14 | $Sr_3Co_2Fe_{24}O_{41}$ | 1190 | 2 | 1 | 10 | 0.4 | 1000 |
| 15 | $Sr_3Co_2Fe_{24}O_{41}$ | 1180 | 3 | 2 | 3 | 0.4 | 1000 |
| 16 | $Sr_3Co_2Fe_{24}O_{41}$ | 1180 | 3 | 2 | 3 | 0.4 | 1000 |
| 17 | $Ba_{0.4}Sr_{2.6}Co_2Fe_{24}O_{41}$ | 1220 | 3 | 2 | 1 | 0.5 | 1130 |
| 18* | $Sr_3Co_2Fe_{24}O_{41}$ | 1180 | — | — | — | — | — |
| 19* | $Sr_3Co_2Fe_{24}O_{41}$ | 1170 | — | — | — | — | — |
| 20* | $Ba_3Co_2Fe_{24}O_{41}$ | 1300 | 2 | 2 | 5 | 0.4 | 1100 |

*is outside of the present invention.

TABLE 2

| Sample No. | c-Axis Orientation Degree Fc | Electric Resistiity ρ (Ω · cm) | Presence or Absence of Induction of Electric Polarization P | Electric Polarization P (μC/m²) | Magnetoelectric Coupling Factor α (s/m) | Presence or Absence of Polarity Reversal of Magnetization M |
|---|---|---|---|---|---|---|
| 1 | 0.947 | $2.23 \times 10^9$ | Yes | 26.1 | $1.05 \times 10^{-9}$ | Yes |
| 2 | 0.930 | $1.45 \times 10^9$ | Yes | 24.3 | $1.19 \times 10^{-9}$ | Yes |
| 3 | 0.910 | $1.93 \times 10^9$ | Yes | 28.0 | $1.25 \times 10^{-9}$ | Yes |
| 4 | 0.898 | $2.87 \times 10^9$ | Yes | 27.0 | $1.07 \times 10^{-9}$ | Yes |
| 5 | 0.872 | $6.19 \times 10^8$ | Yes | 27.6 | $1.48 \times 10^{-9}$ | Yes |
| 6 | 0.859 | $1.46 \times 10^9$ | Yes | 20.1 | $8.32 \times 10^{-10}$ | Not Measured |
| 7 | 0.842 | $3.92 \times 10^9$ | Yes | 26.3 | $1.29 \times 10^{-9}$ | Not Measured |
| 8 | 0.832 | $3.04 \times 10^9$ | Yes | 27.2 | $1.25 \times 10^{-9}$ | Not Measured |
| 9 | 0.792 | $5.28 \times 10^9$ | Yes | 24.6 | $1.48 \times 10^{-9}$ | Not Measured |
| 10 | 0.729 | $5.13 \times 10^8$ | Yes | 26.7 | $9.20 \times 10^{-10}$ | Not Measured |
| 11 | 0.722 | $4.68 \times 10^8$ | Yes | 25.0 | $8.16 \times 10^{-10}$ | Not Measured |
| 12 | 0.707 | $7.38 \times 10^8$ | Yes | 22.8 | $1.00 \times 10^{-9}$ | Not Measured |
| 13 | 0.654 | $1.53 \times 10^9$ | Yes | 22.8 | $1.02 \times 10^{-9}$ | Yes |
| 14 | 0.509 | $1.07 \times 10^9$ | Yes | 16.0 | $5.94 \times 10^{-10}$ | Yes |
| 15 | 0.278 | $7.83 \times 10^9$ | Yes | 15.6 | $7.87 \times 10^{-10}$ | Not Measured |
| 16 | 0.272 | $4.08 \times 10^9$ | Yes | 17.3 | $4.66 \times 10^{-10}$ | Not Measured |
| 17 | 0.931 | $5.54 \times 10^7$ | Yes | 23.3 | $9.05 \times 10^{-10}$ | Yes |
| 18* | 0 | $1.24 \times 10^9$ | Yes | 10.4 | $2.59 \times 10^{-10}$ | No |
| 19* | 0 | — | — | — | — | — |
| 20* | 0.812 | $2.98 \times 10^9$ | No | 0 | 0 | No |

*is outside of the present invention.

[Evaluation of Sample]
(Identification of Primary Component Composition and Crystal Structure)

According to the results of the composition analysis by an ICP-XRF method, it was confirmed that the component composition of the primary component was as shown in Table 2. In addition, it was also confirmed that from the x-ray diffraction spectra, the crystal structures were each a hexagonal Z-type structure.

(c-Axis Orientation Degree)

It was found that the samples of Sample Nos. 1 to 17 and 20 to each of which the crystal orientation was imparted were oriented in a range of 0.272 to 0.947 in terms of the c-axis orientation degree Fc.

Although the relationship between the c-axis orientation degree Fc and the manufacturing conditions has not been clearly understood, it was found that the sample of each of Sample Nos. 1 to 4 in which the firing was performed at a temperature of 1,170° C. had a high c-axis orientation degree Fc, and that when the firing temperature was higher or lower than 1,170° C., the c-axis orientation degree Fc tended to decrease.

Since the sample of Sample No. 18 was a non-oriented sample, and the sample of Sample No. 19 was a powder sample, the c-axis orientation degree Fc was "0".

Figure 4:
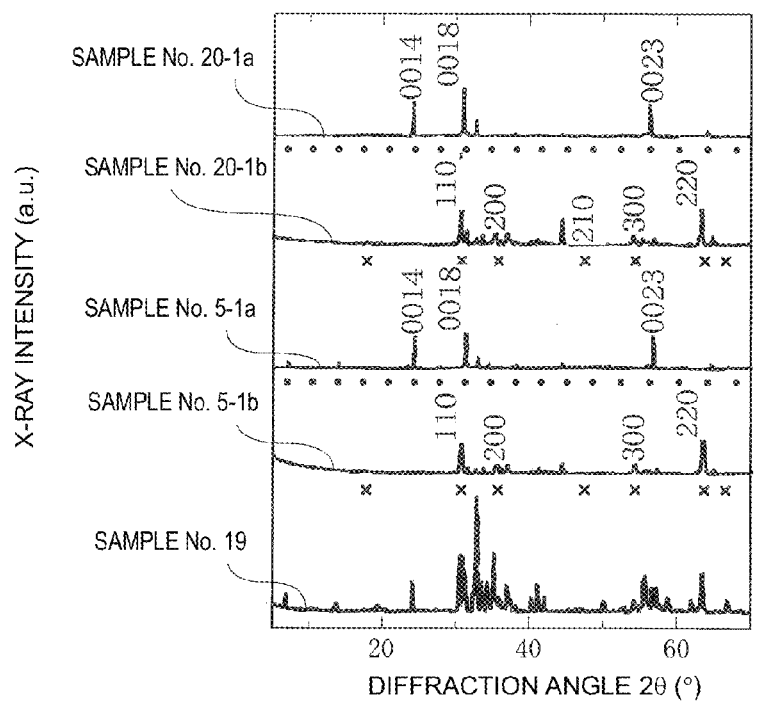
FIG. 4 is a view showing x-ray diffraction spectra of samples of Sample Nos. 5, 19, and 20.

FIG. 4 shows x-ray diffraction spectra of the samples of Sample Nos. 5, 19, and 20.

In the figure, Sample No. 5-1a and 20-1a were each disposed for measurement so that x-rays to be radiated were reflected on an xy plane of the measurement sample, and Sample No. 5-1b and 20-2b were each disposed for measurement so that x-rays to be radiated were reflected on an xz plane of the measurement sample.

In the cases described above, the x axis, the y axis, and the z axis are the same as those shown in FIGS. 2 and 3, the z axis represents the axial core direction of the rotation shaft of the mold in crystal orientation impartment, the xy plane represents a plane that includes no z axis and is orthogonal thereto, the xz plane represents a plane formed by the x axis and the z axis, and the yz plane represents a plane formed by the y axis and the z axis.

In addition, in the figure, the marks ● shown under Sample Nos. 5-1a and 20-1a each indicate a reflection position of the crystal face (00L) expected from a hexagonal Z-type crystal structure, and the marks x shown under Sample Nos. 5-2a and 20-2a each indicate a reflection position of the crystal face (HK0) expected from a hexagonal Z-type crystal structure. In addition, the values, such as (110) and (200), in the x-ray spectra each indicate the crystal face at which the peak intensity is detected in the x-ray spectrum.

In addition, Sample No. 19 indicates an x-ray spectrum of the sample in the form of a powder.

From this FIG. 4, the c-axis orientation degree Fc was obtained using the non-oriented sample of Sample No. 18 as a standard sample, and as shown in Table 2, the c-axis orientation degree Fc of the sample of Sample No. 5 was 0.872, and that of the sample of Sample No. 20 was 0.812.

Figure 5:
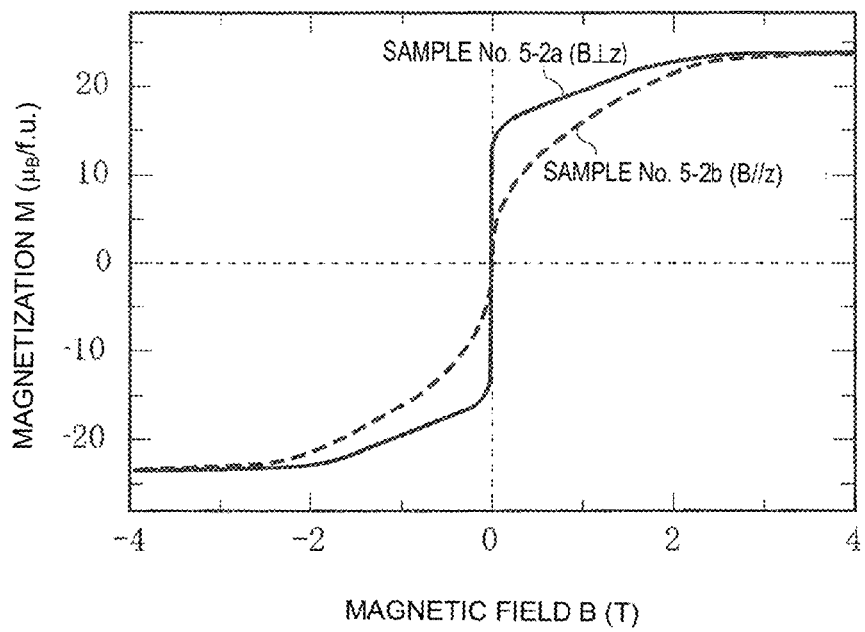
FIG. 5 is a view showing a magnetization curve of the sample of Sample No. 5.

FIG. 5 shows magnetization curves of the sample of Sample No. 5 at 300K. The horizontal axis represents the magnetic field B (T), and the vertical axis represents the magnetization M (μB/f.u.) per formula unit of the sample. In the figure, Sample No. 5-2a shows the case in which the application direction of the magnetic field B is orthogonal to the z axis of the sample (B⊥z), and Sample No. 5-2b shows the case in which the application direction of the magnetic field B is in parallel with the z axis of the sample (B//z).

As apparent from this FIG. 5, it was found that the sample of Sample No. 5 had different magnetization curves depending on the application direction of the magnetization and had a magnetic anisotropy. That is, the sample of Sample No. 5 had a magnetic anisotropy, and from the magnetization curves described above, it was found that a high orientation degree (Fc: 0.872) as shown in Table 2 was obtained.

Figure 6:
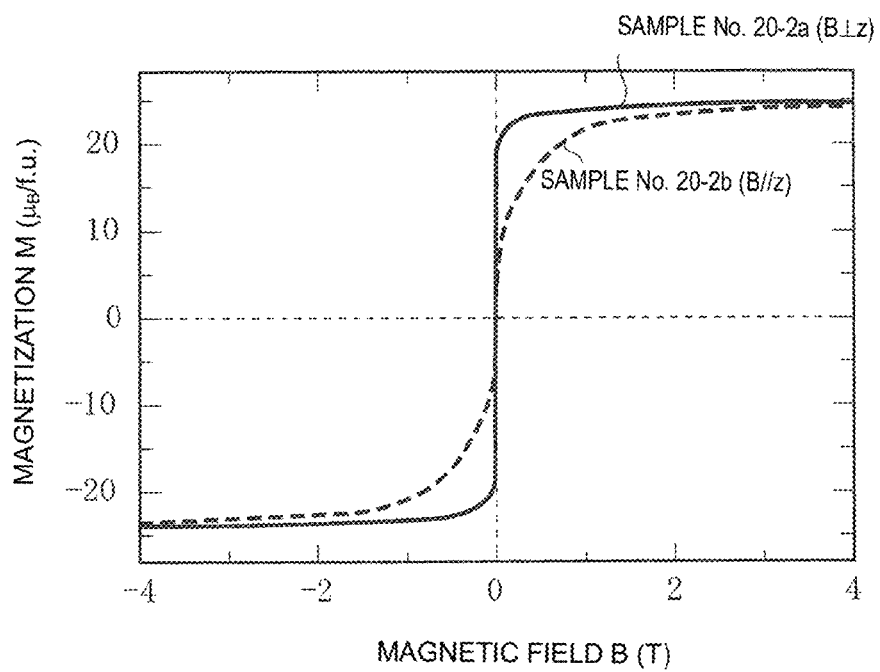
FIG. 6 is a view showing a magnetization curve of the sample of Sample No. 20.

FIG. 6 shows magnetization curves of the sample of Sample No. 20 at 300K. The horizontal axis represents the magnetic field B (T), and the vertical axis represents the magnetization M (μB/f.u.) per formula unit of the sample. In the figure, Sample No. 20-2a shows the case in which the application direction of the magnetic field B is orthogonal to the z axis of the sample (B⊥z), and Sample No. 20-2b shows the case in which the application direction of the magnetic field B is in parallel with the z axis of the sample (B//z).

As apparent from this FIG. 6, it was found that the sample of Sample No. 20 had different magnetization curves depending on the application direction of the magnetization and had a magnetic anisotropy. That is, the sample of Sample No. 20 also had a magnetic anisotropy, and from the magnetization curves described above, it was found that a high orientation degree (Fc: 0.812) as shown in Table 2 was obtained.

(Ferromagnetic Dielectric Characteristics)

As apparent from Table 2, since Sr was not contained in the sample of Sample No. 20, although the sample had a magnetic anisotropy, the electric polarization P was not induced, and as a result, the electric polarization P and the magnetoelectric coupling factor α could not be obtained.

In contrast, since at least Sr, Co, and Fe were contained in the samples of Sample Nos. 1 to 18, when the magnetic field B was applied in a magnetic field range of −2 T to +2 T, the electric polarization P was induced, and as a result, the electric polarization P and the magnetoelectric coupling factor α could be obtained.

However, since the sample of Sample No. 18 was a non-oriented sample in which the crystal axis of the crystal particles was not c-axis oriented, the electric polarization P and the magnetoelectric coupling factor α both were small, such as 10.4 $\mu C/m^2$ and $2.59 \times 10^{-10}$ s/m, respectively.

In contrast, in the samples of Sample Nos. 1 to 17, since the crystal axis of the crystal particles was c-axis oriented, a preferable electric polarization P of 15 $\mu C/m^2$ or more, in particular, of 15.6 to 26.1 $\mu C/m^2$, could be obtained, and a preferable magnetoelectric coupling factor α of $4.0 \times 10^{-10}$ s/m or more, in particular, of $4.66 \times 10^{-10}$ to $1.00 \times 10^{-9}$ s/m, could be obtained. Specifically, it was found that when the c-axis orientation degree Fc was 0.6 or more, a large electric polarization P of 20 $\mu C/m^2$ or more and a large magnetoelectric coupling factor α of $8.0 \times 10^{-10}$ s/m or more could be obtained.

Figure 7:
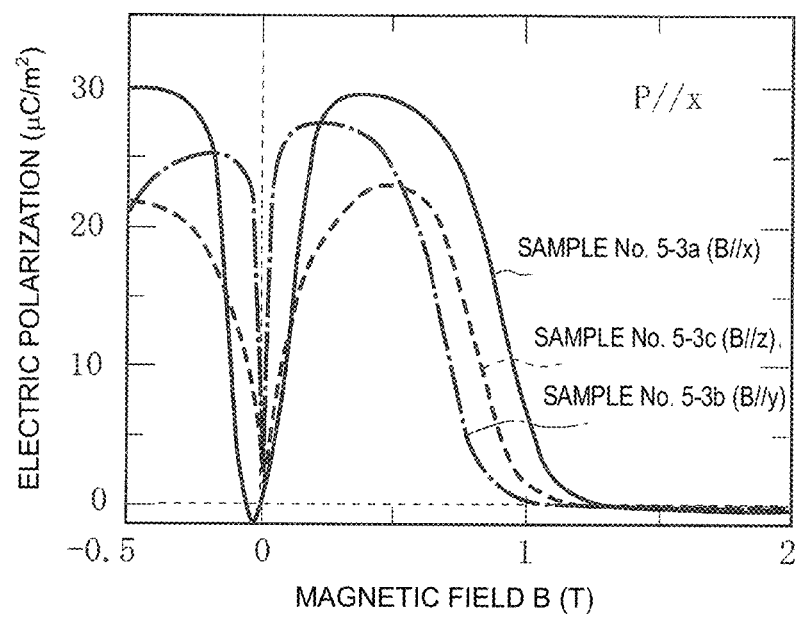
FIG. 7 is a view showing one example of electric polarization characteristics of the sample of Sample No. 5.

FIG. 7 shows the electric polarization characteristics of the sample of Sample No. 5 obtained when the magnetic field was applied in a magnetic field range of −0.5 T to +2 T and when the direction of the electric polarization P was in parallel with the x axis of the sample (P//x). The horizontal axis represents the magnetic field B (T), and the vertical axis represents the electric polarization P ($\mu C/m^2$).

In the figure, Sample No. 5-3a shows the case in which the application direction of the magnetic field B is in parallel with the x axis of the sample (B//x), Sample No. 5-3b shows the case in which the application direction of the magnetic field B is in parallel with the y axis of the sample (B//y), and Sample No. 5-3c shows the case in which the application direction of the magnetic field B is in parallel with the z axis of the sample (B//z).

In addition, the electric polarization P of the sample of Sample No. 5 in Table 2 corresponds to that of Sample No. 5-3b.

As apparent from this FIG. 7, it was found that Sample No. 5-3a (B//x) could obtain a larger electric polarization P than that of each of Sample No. 5-3b (B//y) and Sample No. 5-3c (B//z).

Figure 8:
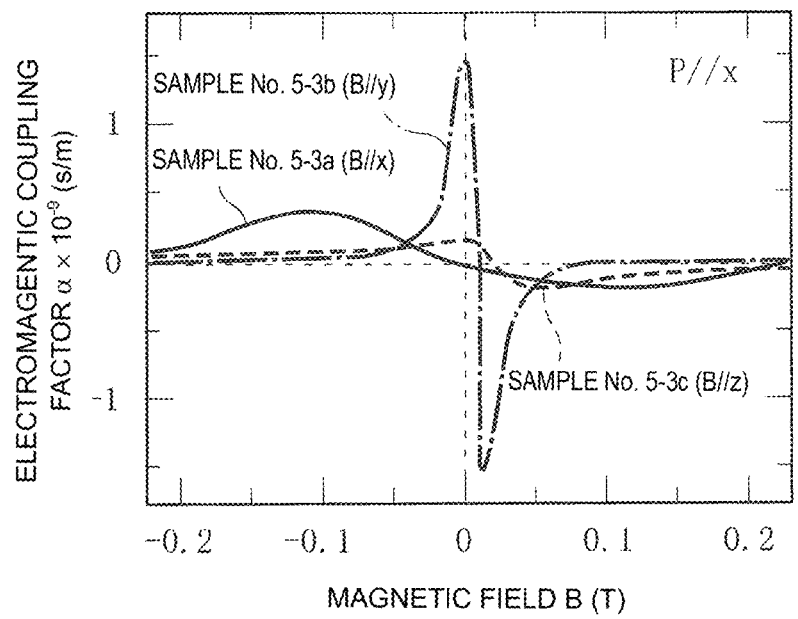
FIG. 8 is a view showing one example of magnetoelectric coupling factor characteristics of the sample of Sample No. 5.

FIG. 8 shows the magnetoelectric coupling factor characteristics of the sample of Sample No. 5 obtained when the magnetic field was applied in a magnetic field range of −3 T to +3 T and when the direction of the electric polarization P was in parallel with the x axis of the sample (P//x). The horizontal axis represents the magnetic field B (T), and the vertical axis represents the magnetoelectric coupling factor $\alpha \times 10^{-9}$ (s/m).

As the case shown in FIG. 7, Sample No. 5-3a shows the case in which the application direction of the magnetic field B is in parallel with the x axis of the sample (B//x), Sample No. 5-3b shows the case in which the application direction of the magnetic field B is in parallel with the y axis of the sample (B//y), and Sample No. 5-3c shows the case in which the application direction of the magnetic field B is in parallel with the z axis of the sample (B//z).

In addition, the magnetoelectric coupling factor α of the sample of Sample No. 5 in Table 2 corresponds to that of the Sample No. 5-3b.

As apparent from this FIG. 8, it was found that Sample No. 5-3b (B//y) could obtain a larger electric polarization P than that of each of Sample No. 5-3a (B//x) and Sample No. 5-3c (B//z).

Table 3 shows the ferromagnetic dielectric characteristics of Sample Nos. 5-3a and 5-3b.

TABLE 3

| Sample No. | Directional Relationship between Magnetic Field B and Electric Polarization P | Application Direction of Magnetic Field B | Direction of Electric Polarization P | Magnetic Field B (T) | Electric Polarization P ($\mu C/m^2$) | Magnetoelectric Coupling Factor α (s/m) |
|---|---|---|---|---|---|---|
| 5-3a | Parallel | Parallel with x Axis | Parallel with x Axis | 0.41 | 30.0 | $3.49 \times 10^{-10}$ |
| 5-3b | Orthogonal | Parallel with y Axis | Parallel with x Axis | 0.214 | 27.6 | $1.48 \times 10^{-9}$ |

As apparent from this Table 3, in comparison between Sample No. 5-3a ((B⊥P), (B//x)) and Sample No. 5-3b ((B//P), (B//y)), the electric polarization P of Sample No. 5-3a was 30.0 $\mu C/m^2$ which was larger than that of Sample No. 5-3b, and the magnetoelectric coupling factor α of Sample No. 5-3b was $1.48 \times 10^{-9}$ s/m which was larger than that of Sample No. 5-3a. In both cases, the results are approximately equivalent to those of a single crystal of $Sr_3Co_2Fe_{24}O_{41}$ which has been already reported in Non-Patent Document 2.

Non-Patent Document 2: Sae Hwan Chun, et al., "Electric Field Control of Nonvolatile Four-State Magnetization at Room Temperature", Physical Review Letters, 108, 177201 (2012)

Although the formation of a single crystal takes time and cost, it was found in the present invention that by the magnetoelectric effect in which the electric polarization is induced by a magnetic field, a polycrystalline oriented oxide ceramic exhibiting excellent performance almost equivalent to that of a single crystal can be easily realized.

[Magnetization Characteristics]

Figure 9:
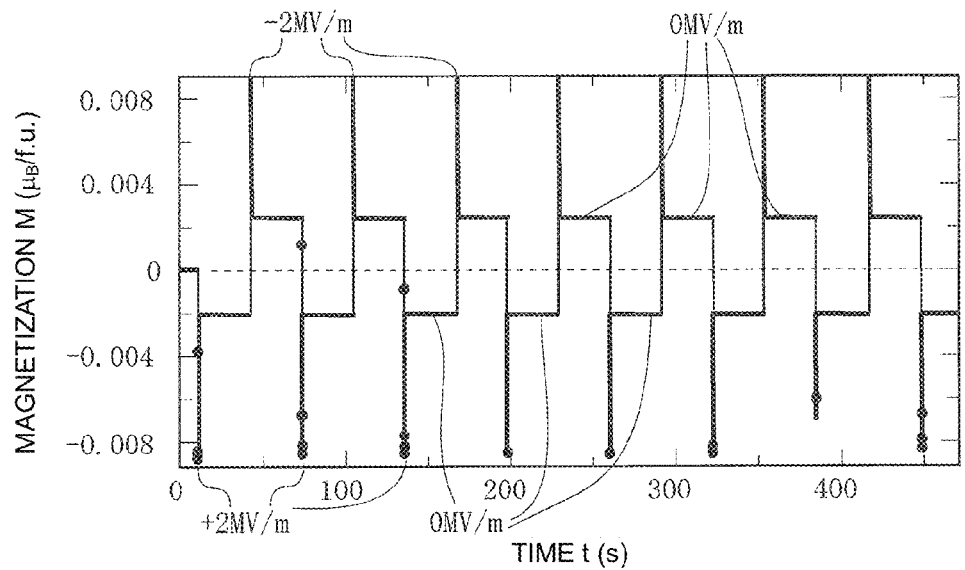
FIG. 9 is a view showing the change in magnetization of the sample of Sample No. 5 obtained when application and non-application of an electric field are repeatedly performed.

FIG. 9 shows the change in magnetization obtained in such a way that after a positive electric field of +2 MV/m and a negative electric field of −2 MV/m are applied to the sample of Sample No. 5, the electric field was set to zero (non-application state). The horizontal axis represents a time t (s), and the vertical axis represents the magnetization M (μB/f.u.) per formula unit.

As apparent from this FIG. 9, when an electric field of +2 MV/m is applied, a negative polar magnetization M is generated, and even when the electric field E is not applied and set to zero, a magnetization M of −0.002 μB/f.u. remains due to the influence of the remnant magnetization, and the negative polarity of the magnetization M is retained without polarity reversal.

Next, when an electric field of −2 MV/m is applied, a positive polar magnetization M is generated. In addition, even when the electric field E is not applied and set to zero, a magnetization M of approximately +0.002 μB/f.u. remains due to the influence of the remnant magnetization, and the positive polarity of the magnetization is retained without polarity reversal.

It was confirmed that the polarity of the magnetization M is changed in accordance with the polarity of the electric field E to be applied as described above, and that when the electric field E is changed from an application state to a non-application state, the polarity of the magnetization that is changed as described above is retained.

Figure 10:
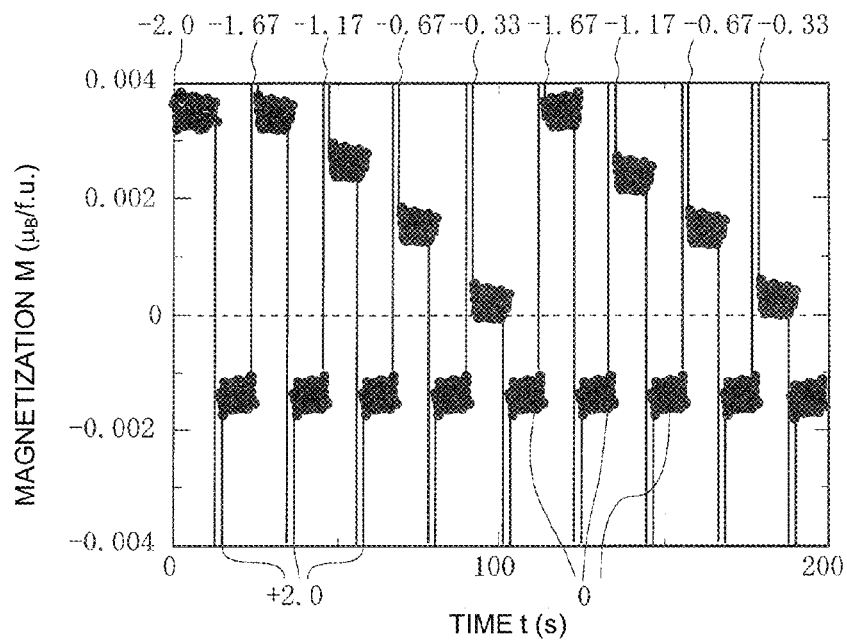
FIG. 10 is a view showing the change in magnetization of the sample of Sample No. 5 obtained when the intensity of an applied electric field is changed.

In addition, FIG. 10 shows the change in magnetization of the sample of Sample No. 5 obtained when different electric fields are applied in a stepwise manner. The horizontal axis represents a time t (s), and the vertical axis represents the magnetization M (μB/f.u.) per formula unit.

That is, when an electric field E of −2.0 MV/m is applied and then set to zero, a positive polar magnetization M of approximately +0.003 to 0.004 μB/f.u. remains. In addition, when an electric field E of +2.0 MV/m is applied, the polarity is reversed, and a negative magnetization M is generated. Subsequently, even if the electric field E is set to zero, due to the influence of the remnant magnetization, a magnetization M of approximately −0.0015 μB/f.u. remains, and hence the negative polarity is retained without polarity reversal. Subsequently, when an electric field of −1.67 MV/m is applied, the polarity of the magnetization is reversed, and when the electric field is set to zero, a positive polar magnetization M of approximately +0.003 to 0.004 μB/f.u. remains. In addition, when an electric field of +2.0 MV/m is applied, the polarity of the magnetization is again reversed, and when the electric field is set to zero, a magnetization of approximately −0.0015 μB/f.u. remains. Subsequently, when an electric field of −1.17 MV/m is applied, the polarity of the magnetization is reversed, and when the electric field is set to zero, the magnetization M is decreased in accordance with the intensity of the applied electric field E, and a positive polar magnetization M of approximately +0.0025 μB/f.u. is obtained. Hereinafter, in a manner similar to that described above, when the positive applied electric field is set constant at +2.0 MV/m, and the negative applied electric field is changed to −0.67 MV/mm and −0.33 mV/m, the magnetization M at a zero electric field is changed in a stepwise manner in accordance with the intensity of the applied electric field, and even if the electric field is set to zero, the polarity of the magnetization obtained by the application of the electric field is still retained.

In the case in which the intensity of an applied electric field is successively changed as described above, it was found that when the electric field is set to zero, the magnetization is changed in accordance with the intensity of the applied electric field.

Figure 11:
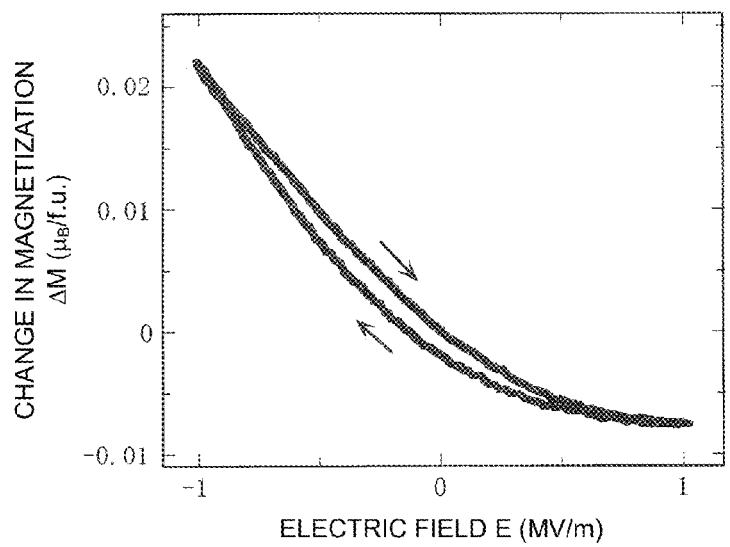
FIG. 11 is a hysteresis curve of the sample of Sample No. 5 showing the change in magnetization with an applied electric field.

FIG. 11 shows the relationship between the electric field and the change in magnetization of the sample of Sample No. 5. The horizontal axis represents the electric field E (MV/m), and the vertical axis represents the change ΔM (μ$_B$/f.u.) of the magnetization.

A polarization treatment was performed by applying a voltage of 300 V at a temperature of 300K and an applied magnetic field of +3 T, and while a magnetic field of 1.5 mT was applied at a temperature of 300K, sweeping was performed in an electric field range of −1 to +1 MV/m.

As apparent from this FIG. 11, it was found that in accordance with the intensity of the applied electric field, the magnetization was changed, and the change in magnetization had a hysteresis in an electric field sweeping direction. In addition, it is believed that by the control of the intensity of the applied electric field using this hysteresis phenomenon, the polarity of the magnetization after the application of an electric field can be controlled.

[Observation of Crystal Particles]

Figure 12:
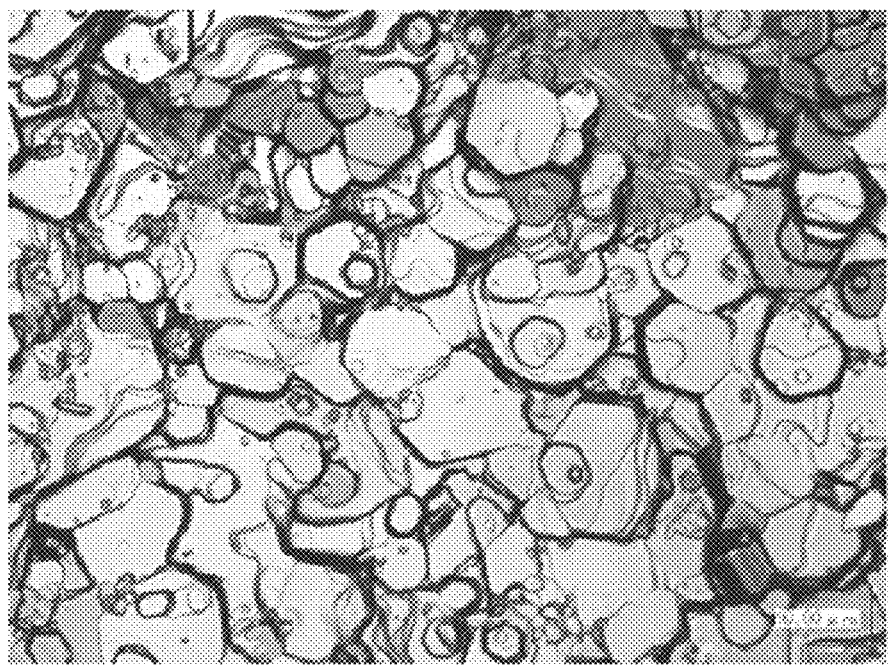
FIG. 12 is a cross-sectional image of an xy plane of the sample of Sample No. 5.
Figure 13:
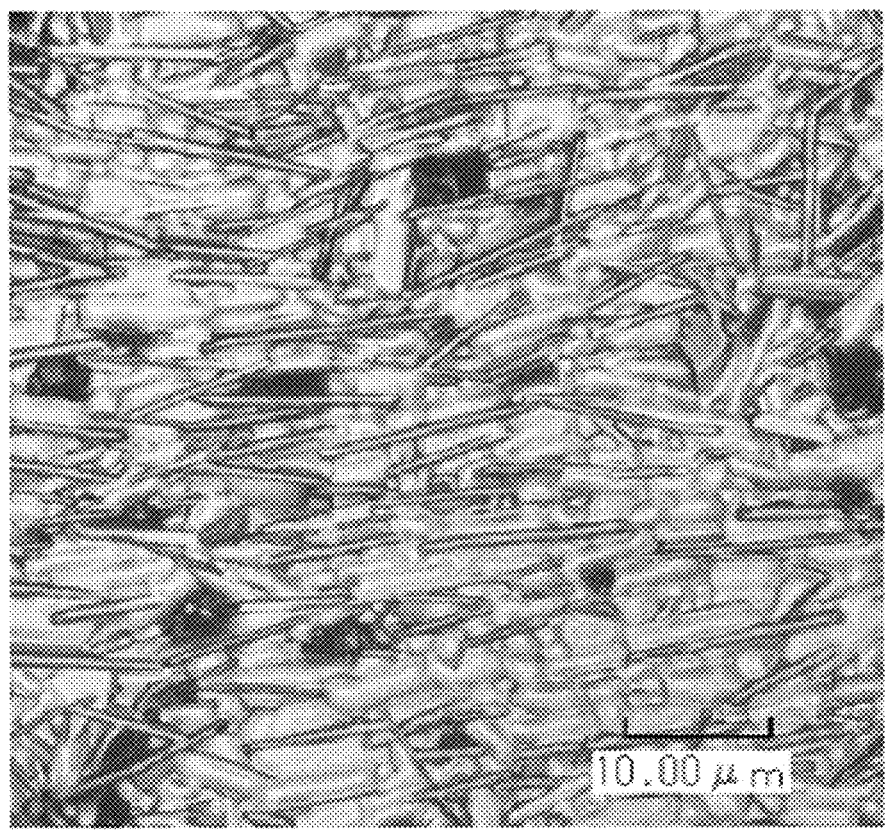
FIG. 13 is a cross-sectional image of a yz plane of the sample of Sample No. 5.

FIGS. 12 and 13 each show a cross-sectional image of the sample of Sample No. 5 taken by a laser microscope, FIG. 12 shows a cross-sectional image of an xy plane of the sample, and FIG. 13 is a cross-sectional image of a yz plane thereof.

As apparent from FIGS. 12 and 13, it was found that the crystal particles had an anisotropic shape, and the longitudinal directions thereof were aligned in one direction. In addition, in the sample of Sample No. 5, the aspect ratio of the crystal particles was 4 to 25.

The magnetoelectric effect material of the present invention can exhibit preferable ferromagnetic dielectric characteristics in an allowable temperature range in which in general, electronic devices are allowed to be used and can be applied to ceramic electronic components, such as a variable inductor, a nonvolatile memory, a magnetic sensor, a voltage sensor, and a magnetic switch.

REFERENCE SIGNS LIST 1 component substrate
2a, 2b external electrode

The invention claimed is:

1. A ferromagnetic dielectric material in which electric polarization is induced by application of a magnetic field and in which magnetization is controlled by application of an electric field, the ferromagnetic dielectric material comprising as a primary component, a polycrystalline oxide ceramic containing at least Sr, Co, and Fe, wherein in the polycrystalline oxide ceramic, a crystal c-axis is oriented and electrically polarized perpendicular to the crystal c-axis orientation, wherein a degree of orientation of the c-axis is 0.2 or more by a Lotgering method, and wherein the polycrystalline oxide ceramic is $(Sr_{1-\alpha}Ba_\alpha)_3(Co_{1-\beta}X_\beta)_2Fe_{24}O_{41+\delta}$, where X represents at least one element selected from Ni, Zn, Mn, Mg, and Cu, $0 \leq \alpha \leq 0.4$, $0 \leq \beta \leq 0.3$, and $-1 \leq \delta \leq 1$.

2. The ferromagnetic dielectric material according to claim 1, wherein the degree of orientation of the c-axis is 0.6 or more by the Lotgering method.

3. The ferromagnetic dielectric material according to claim 1, wherein the crystal particles of the oxide ceramic have an anisotropic shape.

4. The ferromagnetic dielectric material according to claim 3, wherein the crystal particles have a ratio of particle lengths in longitudinal directions to particle lengths in lateral directions of 2 or more, and the longitudinal directions are crystallographically aligned in one direction.

5. The ferromagnetic dielectric material according to claim 4, wherein the ratio is 5 or more.

6. The ferromagnetic dielectric material according to claim 5, wherein the ratio is 10 or more.

7. The ferromagnetic dielectric material according to claim 1, wherein a polarity of the magnetization is changed in accordance with a polarity of the applied electric field, and when the electric field is changed from an application state to a non-application state, the polarity of the magnetization that is changed is retained.

8. The ferromagnetic dielectric material according to claim 7, wherein an intensity of the magnetization is controllable in accordance with an intensity of the applied electric field.

9. The ferromagnetic dielectric material according to claim 1, wherein an intensity of the magnetization is controllable in accordance with an intensity of the applied electric field.

10. The ferromagnetic dielectric material according to claim 7, wherein when the electric field is changed from an application state to a non-application state, the polarity of the magnetization that is changed is retained.

11. The ferromagnetic dielectric material according to claim 1, wherein the ferromagnetic dielectric material is used in an allowable temperature range of an electronic device.

12. The ferromagnetic dielectric material according to claim 11, wherein the allowable temperature range is 300K±50K.

13. A ceramic electronic component comprising:
a component substrate; and
an external electrode on a surface of the component substrate,
wherein the component substrate is formed of the ferromagnetic dielectric material according to claim 1.

14. The ceramic electronic component according to claim 13, wherein the ceramic electronic component is one of a variable inductor, a nonvolatile memory, a voltage sensor, a magnetic sensor, and a magnetic switch.

* * * * *